(12) United States Patent
Denda

(10) Patent No.: US 9,899,310 B2
(45) Date of Patent: Feb. 20, 2018

(54) WIRING SUBSTRATE AND METHOD OF MANUFACTURING THE SAME

(71) Applicant: SHINKO ELECTRIC INDUSTRIES CO., LTD., Nagano-shi, Nagano (JP)

(72) Inventor: Tatsuaki Denda, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 15/293,464

(22) Filed: Oct. 14, 2016

(65) Prior Publication Data

US 2017/0110394 A1   Apr. 20, 2017

(30) Foreign Application Priority Data

Oct. 19, 2015 (JP) .................................. 2015-205242

(51) Int. Cl.
| | |
|---|---|
| *H05K 1/11* | (2006.01) |
| *H01L 23/498* | (2006.01) |
| *H01L 21/48* | (2006.01) |
| *H01L 21/56* | (2006.01) |
| *H01L 23/00* | (2006.01) |
| *H01L 23/31* | (2006.01) |

(52) U.S. Cl.
CPC ...... *H01L 23/49838* (2013.01); *H01L 21/486* (2013.01); *H01L 21/4853* (2013.01); *H01L 21/4857* (2013.01); *H01L 21/563* (2013.01); *H01L 23/3185* (2013.01); *H01L 23/49822* (2013.01); *H01L 23/49827* (2013.01); *H01L 24/16* (2013.01); *H01L 2224/16157* (2013.01); *H01L 2924/07025* (2013.01); *H01L 2924/1579* (2013.01); *H01L 2924/15747* (2013.01); *H01L 2924/2064* (2013.01)

(58) Field of Classification Search
CPC . H05K 1/11; H05K 3/40; H05K 3/421; H05K 3/423; H05K 3/244; H01L 21/486; H01L 21/563; H01L 21/4853; H01L 21/4857; H01L 23/3185; H01L 23/49822; H01L 23/49827; H01L 23/49838
USPC ........... 174/262, 255, 257, 258, 260; 439/55
See application file for complete search history.

(56) References Cited

U.S. PATENT DOCUMENTS

| | | | |
|---|---|---|---|
| 2009/0220683 A1* | 9/2009 | Gotoh .................... | H05K 3/421 427/123 |
| 2010/0065318 A1* | 3/2010 | Nagasawa ......... | H01L 23/49827 174/260 |
| 2011/0094780 A1* | 4/2011 | Uchibori .............. | H05K 1/0265 174/258 |

FOREIGN PATENT DOCUMENTS

| | | |
|---|---|---|
| JP | 59-22393 | 2/1984 |
| JP | 06-104546 | 4/1994 |
| JP | 2005-019918 | 1/2005 |

* cited by examiner

*Primary Examiner* — Xiaoliang Chen
(74) *Attorney, Agent, or Firm* — Rankin, Hill & Clark LLP

(57) ABSTRACT

A wiring substrate includes an insulating layer, at least one via hole formed in the insulating layer, a first wiring layer formed on one surface of the insulating layer and having a droop portion at an end-side of the via hole, a second wiring layer formed on the other surface of the insulating layer, and a metal-plated layer formed in the via hole and configured to connect the second wiring layer and the droop portion of the first wiring layer. One surface of the insulating layer around the via hole is formed as a convex curved surface and the droop portion of the first wiring layer is arranged on the convex curved surface.

4 Claims, 13 Drawing Sheets

WIRING SUBSTRATE AND METHOD OF MANUFACTURING THE SAME

CROSS-REFERENCE TO RELATED APPLICATION

The present application claims priority from Japanese Patent Application No. 2015-205242 filed on Oct. 19, 2015, the entire content of which is incorporated herein by reference.

BACKGROUND

Technical Field

The disclosure relates to a wiring substrate and a method of manufacturing the same.

Related Art

In the related art, a wiring substrate for mounting thereon electronic components such as a semiconductor chip has been known. An example of the wiring substrate has a structure where wiring layers formed on both surfaces of a base material are connected to each other via through-conductors in via holes penetrating the base material.

[Patent Document 1] Japanese Patent Application Publication No. Sho.59-22393A
[Patent Document 2] Japanese Patent Application Publication No. Hei. 6-104546A
[Patent Document 3] Japanese Patent Application Publication No. 2005-19918A As described later in paragraphs of preliminary matters, a manufacturing method of the wiring substrate includes processes of forming via holes in the base material having copper foils formed on both surfaces from above and forming a metal-plated layer toward an upper side from the copper foil of bottoms of the via holes to connect the upper and lower copper foils.

At this time, when there occurs a deviation in plating rate in the via hole, the metal-plated layer and the upper copper foil may not be connected to each other at one end-side in the via hole, so that the reliability of the via connection is not obtained.

SUMMARY

Exemplary embodiments of the invention provide a new structure for securing high reliability of via connection in a wiring substrate where upper and lower wiring layers are connected to each other via a metal-plated layer in via holes and a method of manufacturing the same.

A wiring substrate according to an exemplary embodiment of the invention comprises:
an insulating layer;
at least one via hole formed in the insulating layer;
a first wiring layer formed on one surface of the insulating layer and having a droop portion at an end-side of the via hole;
a second wiring layer formed on the other surface of the insulating layer; and
a metal-plated layer formed in the via hole and configured to connect the second wiring layer and the droop portion of the first wiring layer,
wherein one surface of the insulating layer around the via hole is formed as a convex curved surface and the droop portion of the first wiring layer is arranged on the convex curved surface.

A method of manufacturing a wiring substrate, comprises:
preparing a stacked base material having an insulating layer and a first metal layer formed on an upper surface of the insulating layer;
forming at least one via hole in the stacked base material by punching using a punch and obtaining a droop portion of the first metal layer at an end-side of the via hole;
forming a second metal layer on a lower surface of the insulating layer; and
forming a metal-plated layer configured to connect the second metal layer and the droop portion of the first metal layer in the via hole by an electrolytic plating where the second metal layer is used as a power feeding path for plating.

According to the below disclosure, in the wiring substrate, at least one via hole is formed in the insulating layer, and the first wiring layer is formed on one surface of the insulating layer. One surface of the insulating layer around the via hole is formed as the convex curved surface, and the droop portion of the first wiring layer is arranged on the convex curved surface.

For this reason, when forming the metal-plated layer toward the upper side from the bottom surfaces of the via holes, the metal-plated layer is connected to the droop portion of the first wiring layer with high reliability.

Also, when there is a deviation in plating rate in the via hole, the length of the droop portion of the first wiring layer is adjusted in the via hole in conformity to the deviation in the plating rate, so that the metal-plated layer is connected to the first wiring layer with high reliability.

DETAILED DESCRIPTION

Hereinafter, an exemplary embodiment will be described with reference to the accompanying drawings.

Before describing the exemplary embodiment, preliminary matters, which are bases of the disclosure, are first described. It should be noted that the preliminary matters include personal investigation contents of the inventors and are not a known technology.

Figure 1A:
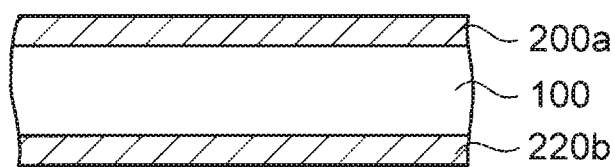
FIGS. 1A to 1C are sectional views for illustrating a problem of a manufacturing method of a wiring substrate relating to preliminary matters (1 thereof).

As shown in FIG. 1A, in a manufacturing method of a wiring substrate relating to the preliminary matters, a base material 100 having a first copper foil 200a bonded to an upper surface and a second copper foil 220a bonded to a lower surface is first prepared.

Figure 1B:
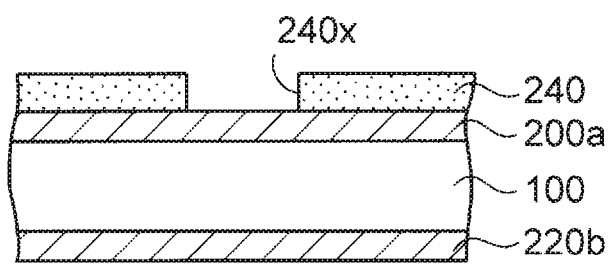

Then, as shown in FIG. 1B, a resist layer 240 having hole-shaped openings 240x is formed on the first copper foil 200a of the base material 100.

Figure 1C:
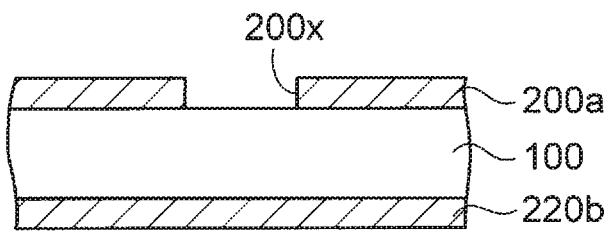

Subsequently, as shown in FIG. 1C, the first copper foil 200a is wet-etched through the openings 240x of the resist layer 240. Thereafter, the resist layer 240 is removed. Thereby, the first copper foil 200a is formed with openings 200x.

Figure 2A:
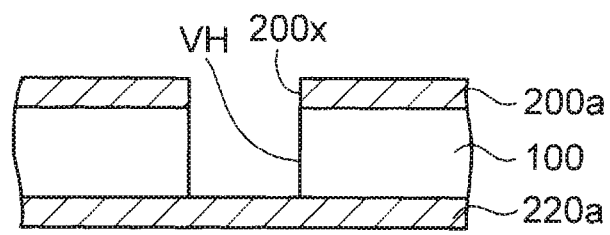
FIGS. 2A to 2C are sectional views for illustrating the problem of the manufacturing method of a wiring substrate relating to the preliminary matters (2 thereof).

Also, as shown in FIG. 2A, the base material 100 is penetrated by laser through the openings 200x of the first copper foil 200a and is thus formed with via holes VH. At this time, the second copper foil 220a remains on bottoms of the via holes VH.

Figure 2B:
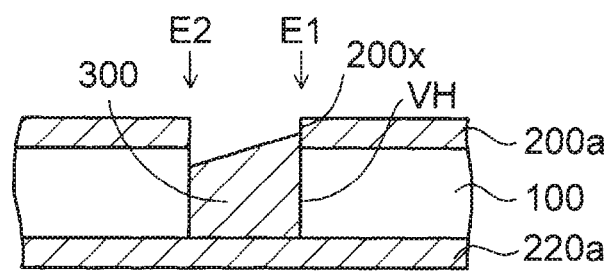
Figure 2C:
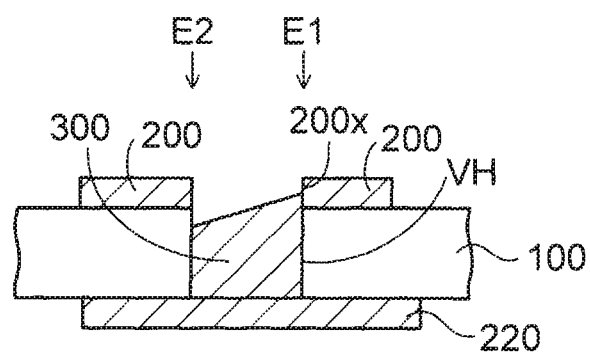

Then, as shown in FIG. 2B, a metal-plated layer 300 is formed from the bottoms of the via holes VH of the base material 100 toward an upper side by an electrolytic plating where the second copper foil 220a is used as a power feeding path for plating.

At this time, a deviation in plating rate is likely to occur in one via hole VH of the base material 100, so that a height of the metal-plated layer 300 is different in the one via hole VH. For this reason, when the electrolytic plating is continuously performed, a situation where the metal-plated layer 300 at one end E1 in the via hole VH is connected to the first copper foil 200a but the metal-plated layer 300 at the other end E2 in the via hole VH is not connected to the first copper foil 200a occurs.

Further, at this point of time, since the metal-plated layer 300 in the via hole VH is electrically connected to the first copper foil 200a, an area of the power feeding for plating considerably increases. Thereby, a current density per unit area of the electrolytic plating sharply decreases, so that the plating rate is extremely lowered and the plating is little made depending on conditions.

For this reason, even when the electrolytic plating is continuously performed, the metal-plated layer 300 at the other end E2 in the via hole VH may still remain separated from the first copper foil 200a.

Thereafter, the first copper foil 200a and the second copper foil 220a on both surfaces are patterned by photolithography and wet etching, so that a first wiring layer 200 is formed on an upper surface of the base material 100 and a second wiring layer 220 is formed on a lower surface of the base material 100.

The first wiring layer 200 and the second wiring layer 220 on both surfaces are connected to each other via the metal-plated layer 300 in the via holes VH.

However, as described above, since the first wiring layer 200 and the metal-plated layer 300 may not be connected to each other at the other end E2 in the via hole VH, the reliability of the connection between the first wiring layer 200 and the metal-plated layer 300 is deteriorated.

Like this, since the deviation in the height of the metal-plated layer 300 is likely to occur in the via hole VH, the high reliability of the via connection cannot be obtained.

Also, since the deviation in the plating rate is also likely to occur between a plurality of via holes VH in the base material 100, the metal-plated layer 300 may not be connected to the first wiring layer 200 in the via holes VH of one region in the base material 100.

A wiring substrate and a method of manufacturing the same according to an exemplary embodiment, which is to be described later, can solve the above problems.

(Exemplary Embodiment)

Figure 13A:
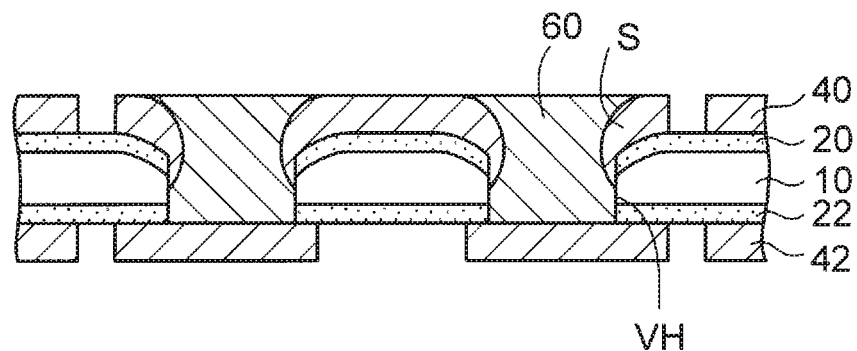
FIGS. 13A and 13B are sectional views depicting the manufacturing method of the wiring substrate according to the exemplary embodiment (11 thereof).
Figure 13B:
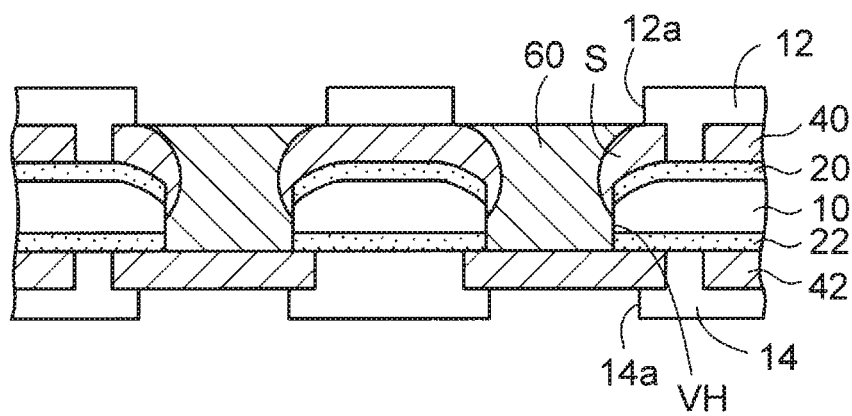
Figure 14:
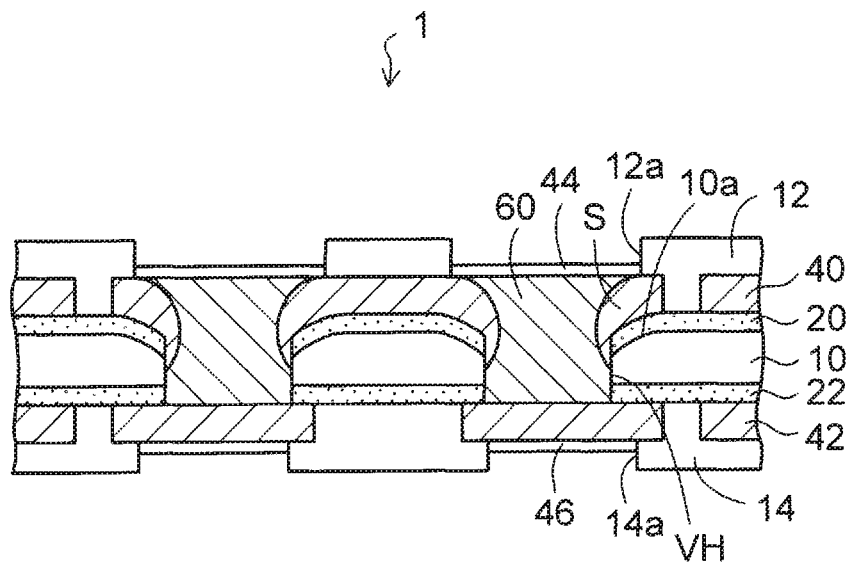
FIG. 14 is a sectional view depicting a wiring substrate according to the exemplary embodiment.

FIGS. 3A to 13B depict a manufacturing method of a wiring substrate in accordance with an exemplary embodiment, and FIG. 14 depicts a wiring substrate of the exemplary embodiment. In the below, while describing the manufacturing method of the wiring substrate, a structure of the wiring substrate is described.

Figure 3A:
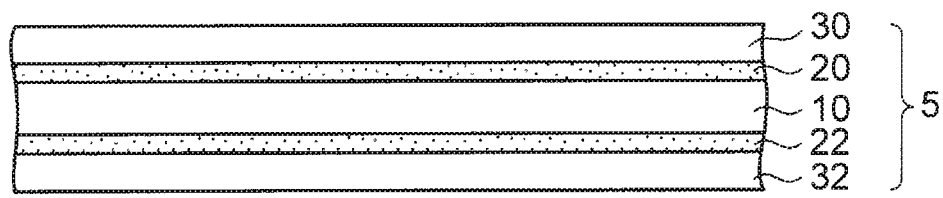
FIGS. 3A to 3C are sectional views depicting a manufacturing method of a wiring substrate according to an exemplary embodiment (1 thereof).

In the manufacturing method of the wiring substrate of the exemplary embodiment, a base material 5 having a stacked structure as shown in FIG. 3A is first prepared. The base material 5 has an insulating layer 10 at a central portion in a thickness direction. As an example of the insulating layer 10, a polyimide film having a thickness of 50 μm is used.

Also, a first adhesive layer 20 is formed on an upper surface of the insulating layer 10, and a second adhesive layer 22 is formed on a lower surface of the insulating layer 10. As an example of the first adhesive layer 20 and the second adhesive layer 22, an epoxy resin layer having a thickness of 10 μm to 20 μm is used.

Further, a first carrier film 30 is bonded to the upper surface-side of the insulating layer 10 via the first adhesive layer 20. An adhesive surface of the first carrier film 30 is formed with a release agent, so that the first carrier film 30 can be easily peeled off from the first adhesive layer 20.

Also, a second carrier film 32 is bonded to the lower surface-side of the insulating layer 10 via the second adhesive layer 22. Likewise, an adhesive surface of the second carrier film 32 is formed with a release agent, so that the second carrier film 32 can be easily peeled off from the second adhesive layer 22.

As an example of the first carrier film 30 and the second carrier film 32, a PET film having a thickness of about 25 μm is used.

In this way, the first and second carrier films 30, 32 are bonded to both surfaces of the insulating layer 10 via the first and second adhesive layers 20, 22, so that the base material 5 is established.

Figure 3B:
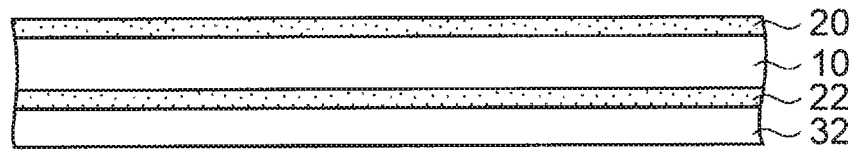

Then, as shown in FIG. 3B, the first carrier film 30 of the upper surface-side is peeled off from the base material 5 of FIG. 3A, so that the first adhesive layer 20 is exposed.

Figure 3C:
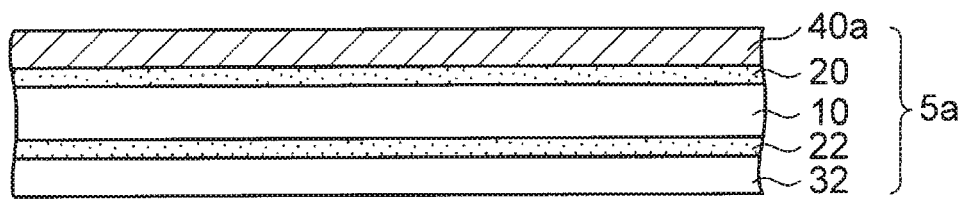

Subsequently, as shown in FIG. 3C, a first copper foil 40a having a thickness of 15 μm to 35 μm is prepared, and the first copper foil 40a is bonded to the upper surface-side of the insulating layer 10 via the first adhesive layer 20. Thereby, a stacked base material 5a where the first copper foil 40a is formed at the upper surface-side of the insulating layer 10 is obtained. The first copper foil 40a is an example of the first metal layer.

In the example of FIG. 3C, the first copper foil 40a is bonded to the upper surface of the insulating layer 10 via the first adhesive layer 20. However, a configuration where the first adhesive layer 20 is omitted and the first copper foil 40a is thermally pressed on the insulating layer 10 may also be adopted. Alternatively, a configuration where the first adhesive layer 20 is omitted and a copper layer is formed on the upper surface of the insulating layer 10 by a sputtering method and a plating method.

Figure 4:
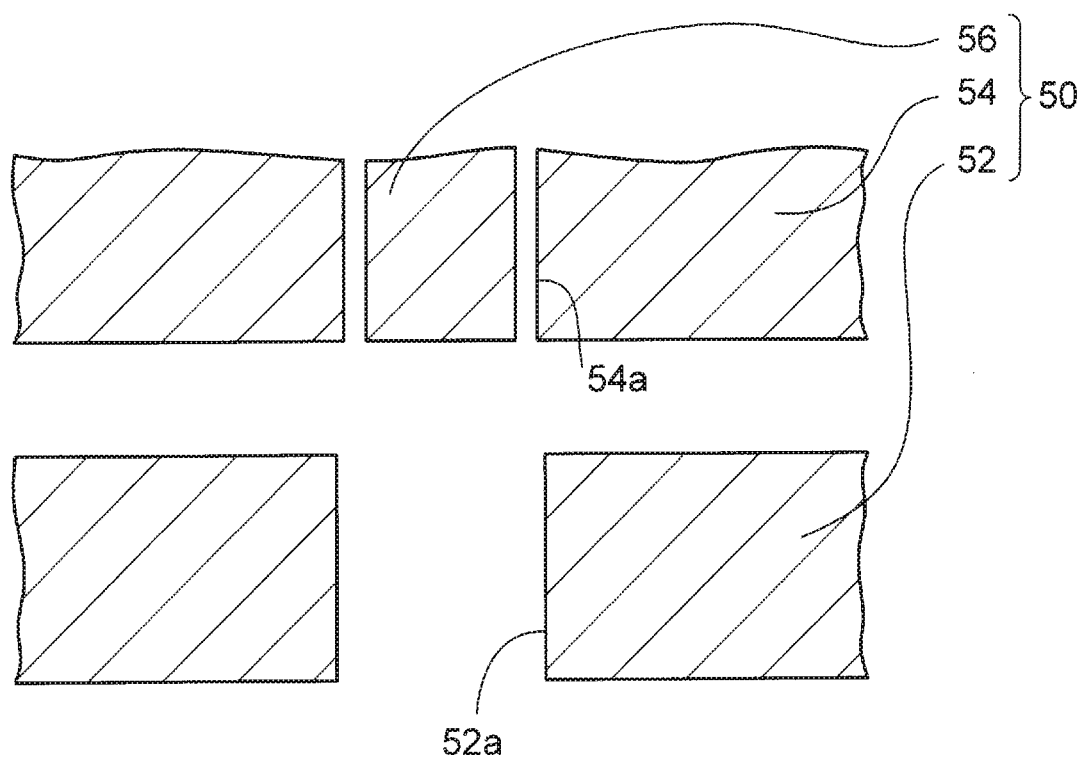
FIG. 4 is a sectional view depicting the manufacturing method of the wiring substrate according to the exemplary embodiment (2 thereof).

Then, a die 50 configured as shown in FIG. 4 is prepared. The die 50 has a lower die 52 for receiving a work. Also, the die 50 has a stripper 54 for holding the work above the lower die 52.

Further, the die 50 has a punch 56 for punching the work. The punch 56 is arranged in an opening 54a of the stripper 54. The punch 56 is connected to a moving unit (not shown), so that it can be moved vertically.

The lower die 52 has an opening 52a in which the punch 56 is to be disposed when punching the work.

Figure 5A:
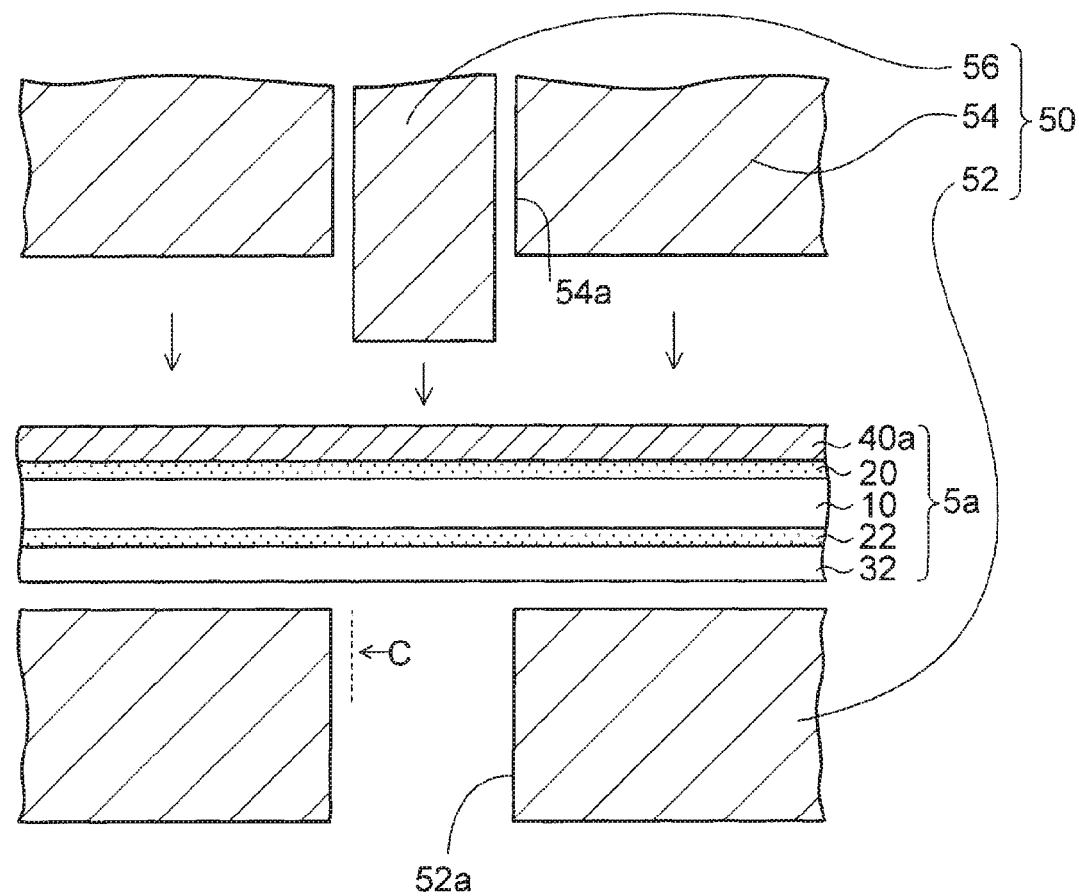
FIGS. 5A and 5B are sectional views depicting the manufacturing method of the wiring substrate according to the exemplary embodiment (3 thereof).

Subsequently, as shown in FIG. 5A, the stacked base material 5a shown in FIG. 3C is conveyed and disposed between the lower die 52 and the stripper 54 of the die 50.

Also, the punch 56 of the die 50 is moved downward to punch the stacked base material 5a in a thickness direction. Subsequently, the stacked base material 5a is conveyed outside and taken out of the die 50.

Figure 5B:
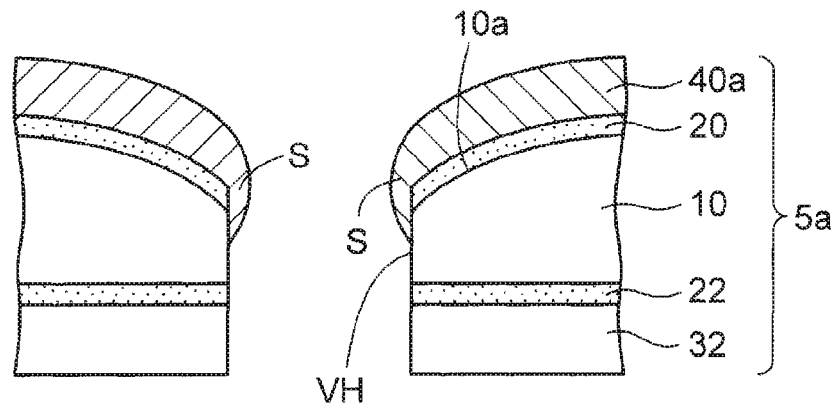

Thereby, as shown in FIG. 5B, a via hole VH penetrating a region ranging from the upper surface of the first copper foil 40a of the stacked base material 5a to the lower surface of the second carrier film 32 is formed. A diameter of the via hole VH is set to 150 μm, for example.

The first copper foil 40a is pressed and punched by the punch 56 with being sandwiched and fixed between the lower die 52 and the stripper 54 of the die 50.

At this time, a clearance C is formed between a side surface of the punch 56 and a side surface of the opening 52a of the lower die 52. For this reason, when punching the first copper foil 40a of the stacked base material 5a by the punch 56, a worked surface of the first copper foil 40a extends downwards in the clearance C, so that droop portion S is formed at an end-side of the via hole. A size of the clearance C is set to 10 μm to 20 μm, for example.

In the example of FIG. 5B, the droop portion S of the first copper foil 40a is suspended inside the via hole VH to cover parts of a side surface of the first adhesive layer 20 and a side surface of the insulating layer 10.

Figure 6:
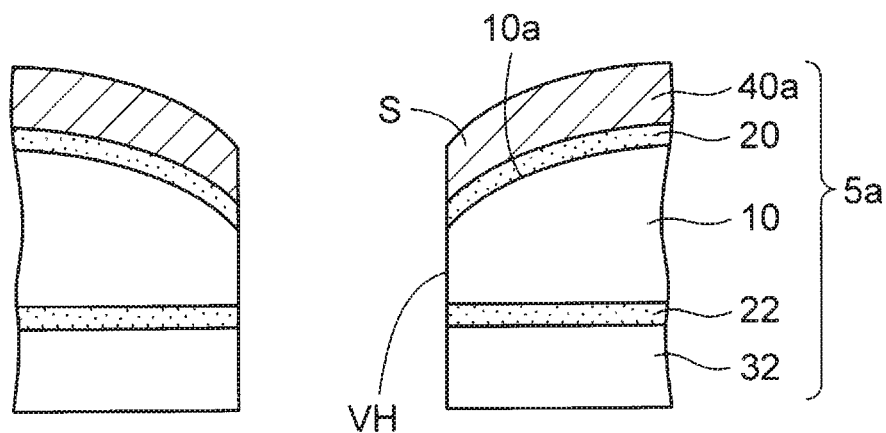
FIG. 6 is a sectional view depicting the manufacturing method of the wiring substrate according to the exemplary embodiment (4 thereof).

Alternatively, as shown in FIG. 6, the via hole VH having straight side surfaces may be formed depending on conditions of the pressing. In this case, the side surface of the first copper foil 40a, the side surface of the first adhesive layer 20 and the side surface of the insulating layer 10 are flush with each other. Then, the droop portion S of the first copper foil 40a is formed at the end-side of the via hole.

As shown in FIGS. 5B and 6, the upper surface of the insulating layer 10 around the via hole VH is formed as a convex curved surface 10a, and the droop portion S of the first copper foil 40a is arranged on the convex curved surface 10a.

Figure 7A:
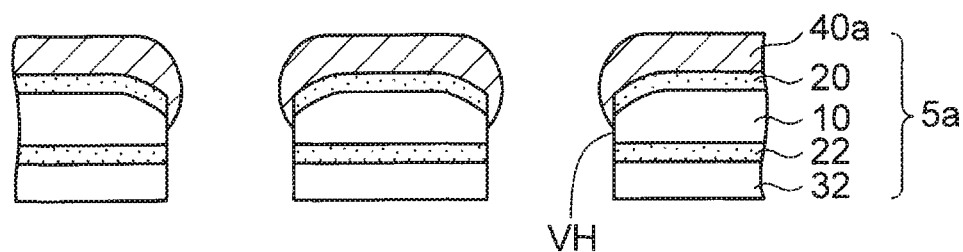
FIGS. 7A to 7C are sectional views depicting the manufacturing method of the wiring substrate according to the exemplary embodiment (5 thereof).

In subsequent processes, a structure having the via hole VH shown in FIG. 5B is described. FIG. 7A depicts a region of the stacked base material 5a having two via holes VH formed therein.

Figure 7B:
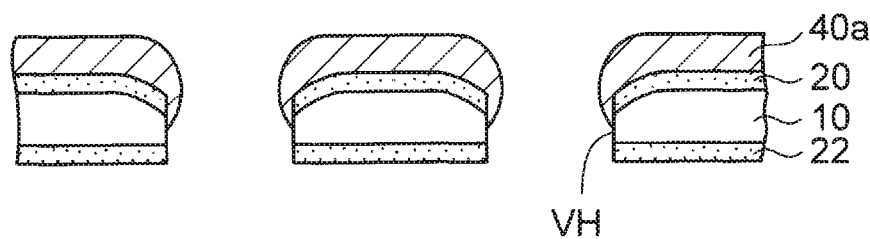
Figure 7C:
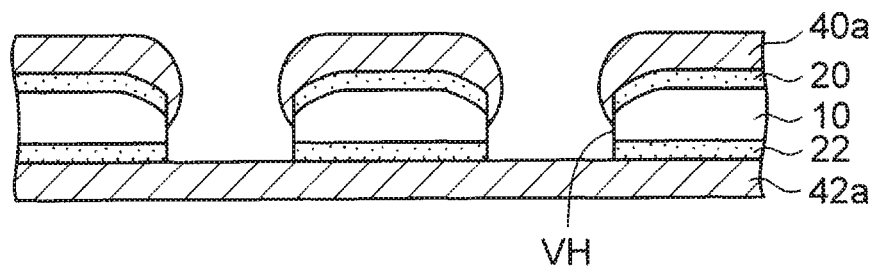

As shown in FIG. 7B, the second carrier film 32 on the lower surface-side of the stacked base material 5a shown in FIG. 7A is peeled off to expose the second adhesive layer 22. Also, as shown in FIG. 7C, a second copper foil 42a having a thickness of 15 μm to 35 μm is prepared and the second copper foil 42a is bonded to the lower surface-side of the insulating layer 10 via the second adhesive layer 22. The second copper foil 42a is an example of the second metal layer.

Alternatively, a configuration where the second adhesive layer 22 is omitted and the second copper foil 42a is thermally pressed to the lower surface of the insulating layer 10 may be adopted.

Figure 8A:
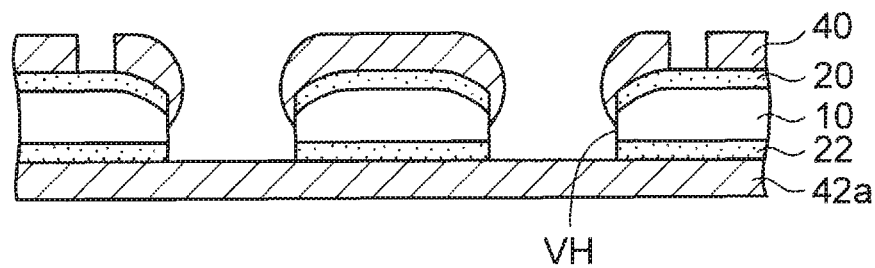
FIGS. 8A and 8B are sectional views depicting the manufacturing method of the wiring substrate according to the exemplary embodiment (6 thereof).

Then, as shown in FIG. 8A, a dry film resist layer (not shown) having openings for patterning the first copper foil 40a is formed on the structure of FIG. 7C on the basis of photolithography.

Also, the first copper foil 40a is wet-etched through the openings of the dry film resist layer (not shown). Thereby, the first copper foil 40a is patterned, so that a first wiring layer 40 having the droop portions S provided at the end-sides of the via holes VH is obtained.

Figure 8B:
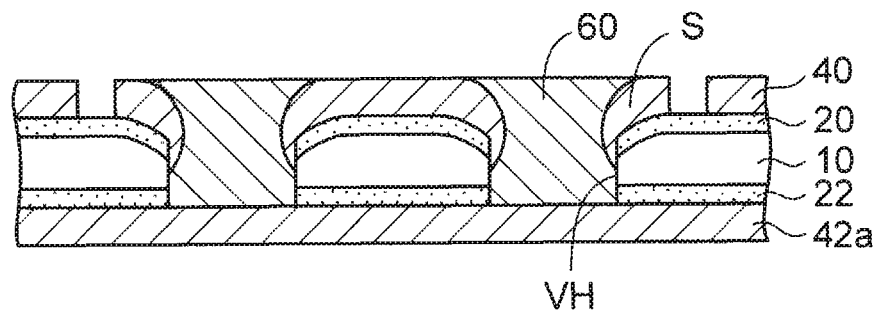

Subsequently, as shown in FIG. 8B, a metal-plated layer 60 is formed from bottom surfaces of the via holes VH toward the upper side by electrolytic plating where the second copper foil 42a is used as a power feeding path for plating. The metal-plated layer 60 is preferably formed of copper. However, a variety of metals for wiring may also be used.

FIG. 8B depicts an example where a deviation in plating rate is small in one via hole VH and an upper surface of the metal-plated layer 60 is substantially flat.

In the exemplary embodiment, the droop portions S of the first wiring layer 40 are arranged at the end-sides of the via holes VH. For this reason, when forming the metal-plated layer 60 from the bottom surfaces of the via holes VH toward the upper side, the metal-plated layer 60 is securely connected to the droop portions S of the first wiring layer 40 with high reliability.

Also, since it is preferable when the metal-plated layer 60 is connected to the lowest parts of the droop portions S of the first wiring layer 40, it is not necessarily required to fill the entire via holes VH with the metal-plated layer 60. Thereby, since it is possible to shorten processing time of the electrolytic plating, it is possible to improve the throughput and to save the cost.

In addition to the above example, an example where the considerable deviation in the plating rate occurs in one via hole VH is described. When the plating rate is slower at one end E1 than at the other end E2 in a radial direction in the via hole VH, a length of the droop portion S1 of the first copper foil 40a at one end E1 of the via hole VH is formed to be greater than a length of the droop portion S2 at the other end E2, as shown in FIG. 9B.

Figure 9A:
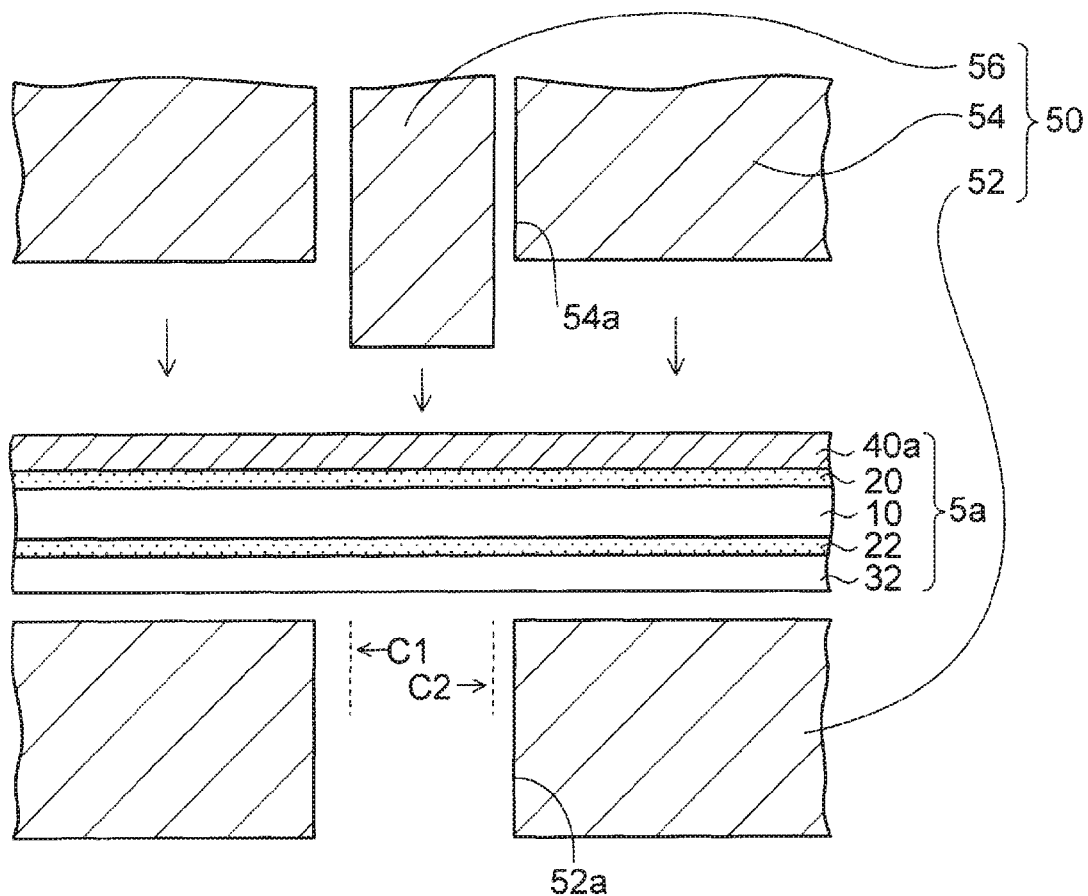
FIGS. 9A and 9B are sectional views depicting the manufacturing method of the wiring substrate according to the exemplary embodiment (7 thereof) and FIG. 9C is an explanation view showing a positional relationship between a punch and a lower die of a die viewed from above.
Figure 9B:
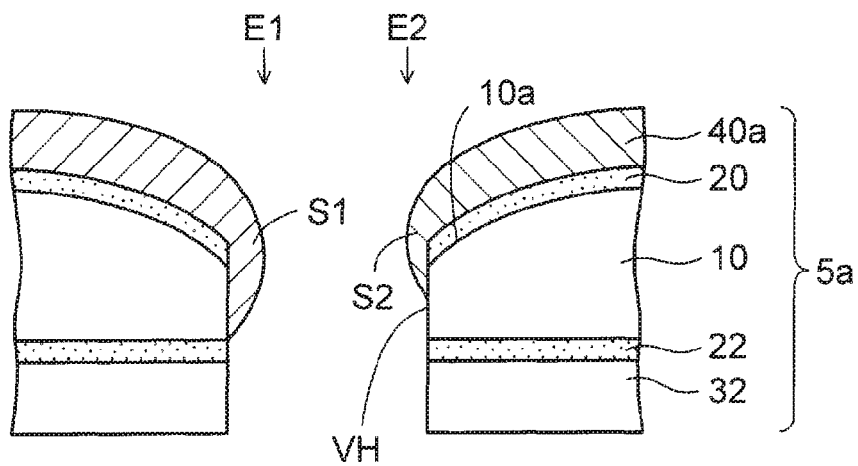
Figure 9C:
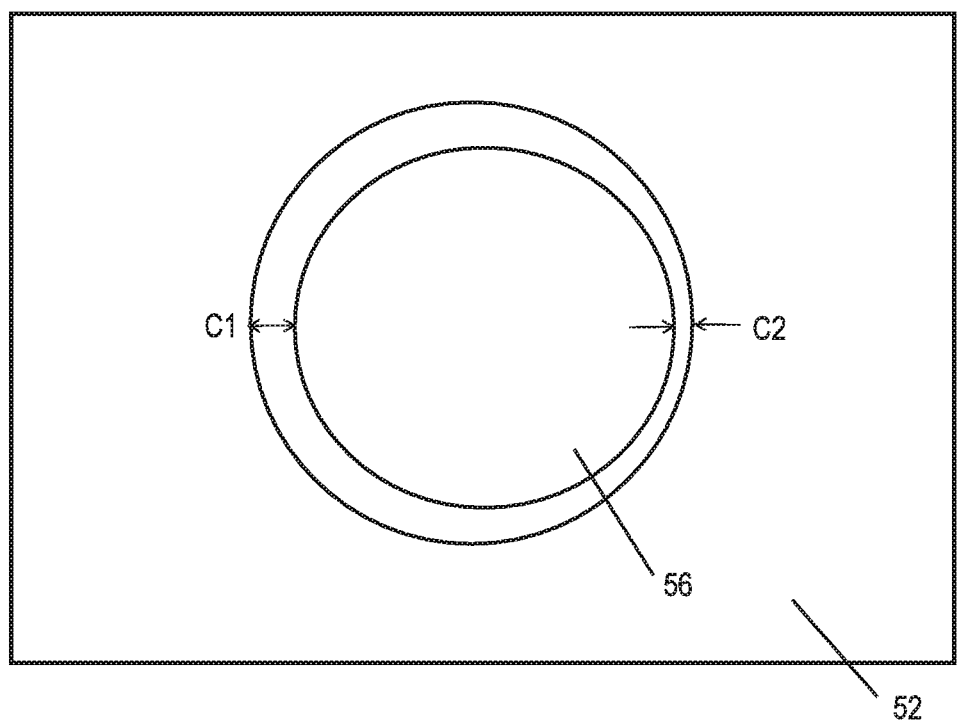

When forming the above structure, a clearance C1 at one end E1 between the side surface of the opening 52a of the lower die 52 and the side surface of the punch 56 is set to be greater than a clearance C2 at the other end E2, as shown in the die 50 of FIG. 9A and FIG. 9C. For example, a size of the clearance C1 at one end E1 is set to be 1.5 to 2 times of the clearance C2 at the other end E2.

Thereby, as shown in FIG. 9B, the length of the droop portion S1 of the first copper foil 40a at one end E1 at which the clearance C1 of the die 50 is greater can be made greater than the other part.

Figure 10:
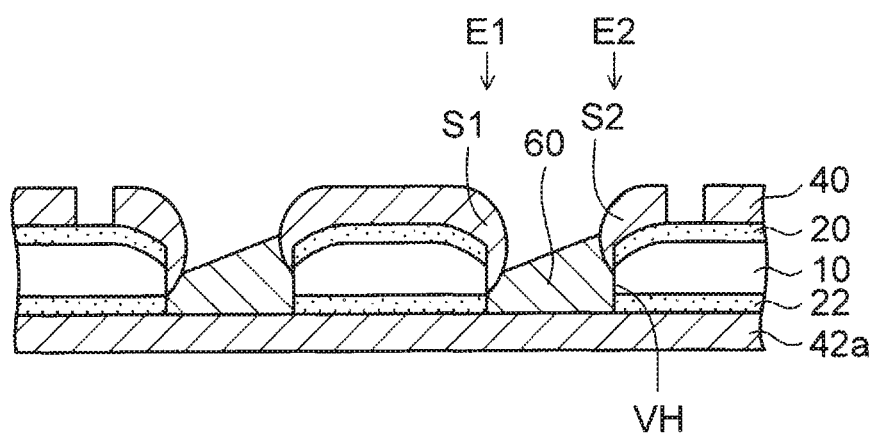
FIG. 10 is a sectional view depicting the manufacturing method of the wiring substrate according to the exemplary embodiment (8 thereof).

Therefore, as shown in FIG. 10, when forming the metal-plated layer 60 in the via holes VH, a length of the droop portion S1 of the first wiring layer 40 at one end E1 at which the plating rate is slower is greater than the droop portion S2 at the other end E2.

For this reason, even when the deviation in the plating rate occurs in the via hole VH, the metal-plated layer 60 is simultaneously connected to the droop portion S1 of the first wiring layer 40 at one end E1 in the via hole VH and the droop portion S2 at the other end E2.

Thereby, it is possible to securely connect the metal-plated layer 60 and the first wiring layer 40 even at one end E1 at which the plating rate is slower in the via hole VH.

In this way, it is possible to improve the reliability of the via connection by adjusting the lengths of the droop portions S1, S2 of the first wiring layer 40a in conformity to the deviation in the plating rate in the via hole VH.

Also, another example where the deviation in the plating rate occurs between a plurality of via holes VH in the stacked base material 5a is described.

For example, there is a tendency that the plating rate in the via hole VH is slower at a peripheral edge portion of the stacked base material 5a than the plating rate in the via hole VH at a central portion thereof. FIG. 11B depicts a shape of the via hole VH of the peripheral edge portion at which the plating rate is slower.

In this case, as shown in FIG. 11B, all lengths of droop portions SA of the first copper foil 40a at the peripheral edge portion at which the plating rate is slower are set to be greater than the droop portions (which are the same as the droop portions S shown in FIG. 5B) of the first copper foil 40a at the central portion at which the plating rate is faster.

Figure 11A:
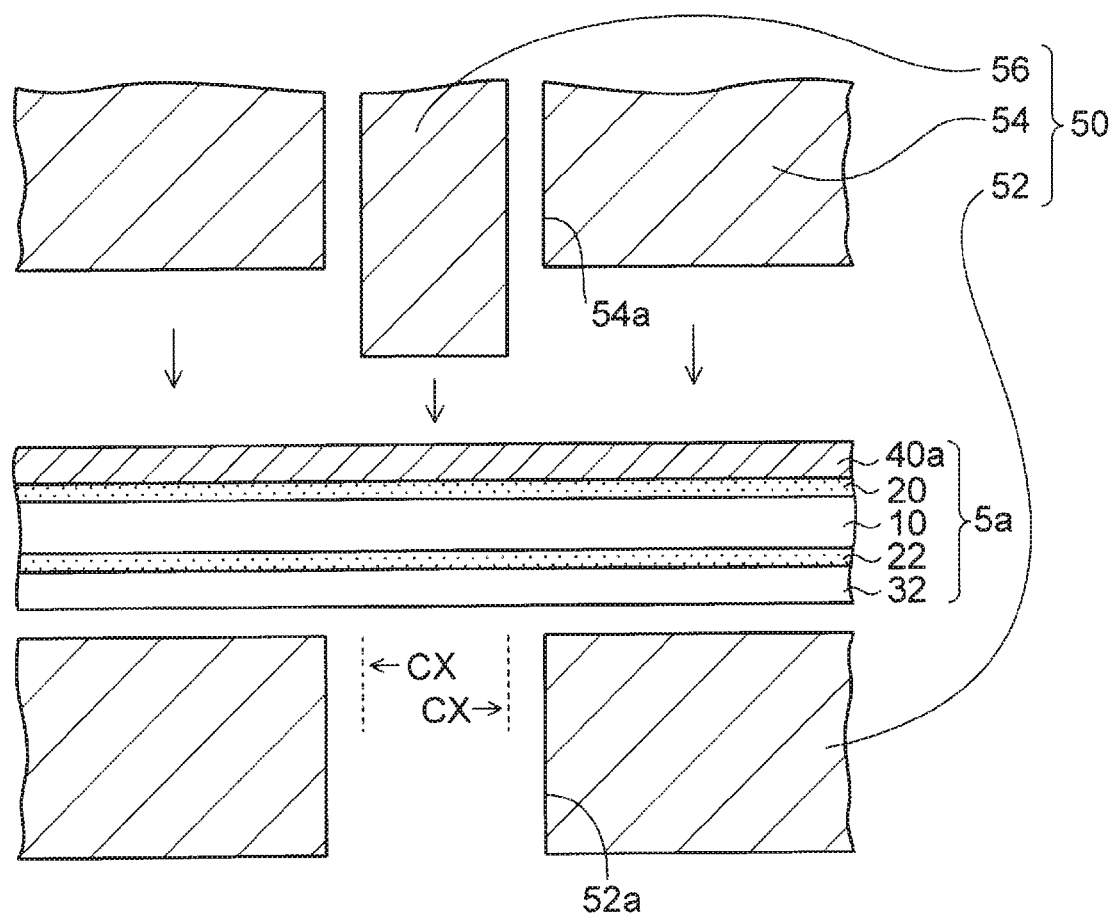
FIGS. 11A and 11B are sectional views depicting the manufacturing method of the wiring substrate according to the exemplary embodiment (9 thereof).
Figure 11B:
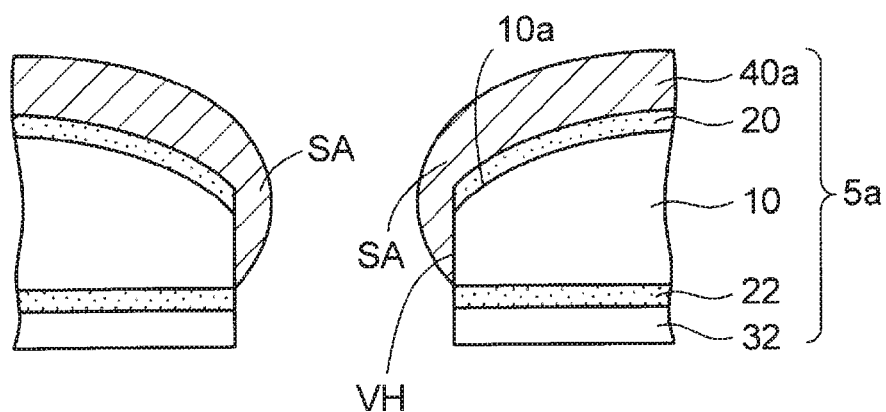

When forming the above structure, all clearances CX of the die 50 corresponding to the via holes VH at the peripheral edge portion at which the plating rate is slower are set to be greater than the clearance C of the die 50 shown in FIG. 5A, as shown in the die 50 of FIG. 11A.

Also, a clearance (not shown) of the die 50 corresponding to the via hole VH at the central portion at which the plating rate is faster is set to be the same as the clearance C of the die 50 shown in FIG. 5.

In this way, the die is preferably designed so that the clearance CX of the die 50 corresponding to the portion at which the plating rate is slower is greater than the clearance of the die 50 corresponding to the portion at which the plating rate is faster.

Thereby, as shown in FIG. 11B, since the entire clearance CX around the punch 56 is set greater at the peripheral edge portion at which the plating rate is slower, it is possible to make the length of the droop portion SA of the first copper foil 40a greater than the other region.

Figure 12:
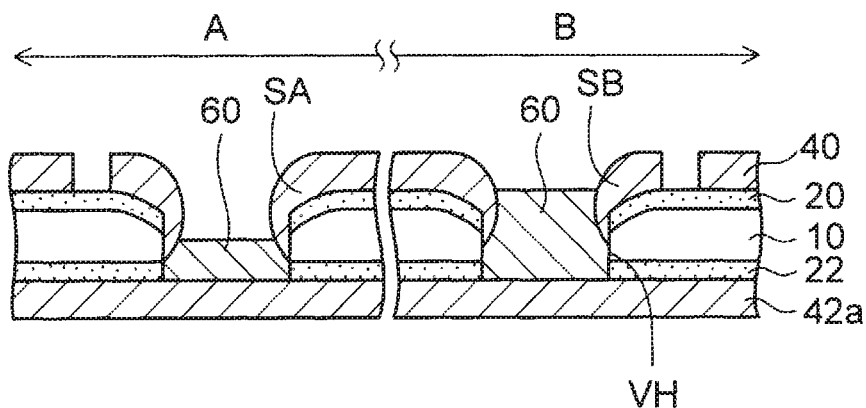
FIG. 12 is a sectional view depicting the manufacturing method of the wiring substrate according to the exemplary embodiment (10 thereof).

For this reason, as shown in FIG. 12, when forming the metal-plated layer 60 in the via holes VH, the lengths of the droop portions SA of the first wiring layer 40 at the peripheral edge portion A at which the plating rate is slower are set to be greater than the lengths of the droop portions SB of the first wiring layer 40 at the central portion B at which the plating rate is faster.

Thereby, the metal-plated layer 60 is simultaneously connected to the droop portions SA of the first wiring layer 40 at the peripheral edge portion A at which the plating rate is slower and the droop portions SB of the first wiring layer 40 at the central portion B at which the plating rate is faster.

Therefore, even when the plating rate is slower and the height of the metal-plated layer 60 is lower at the peripheral edge portion A of the stacked base material 5a, the metal-plated layer 60 is connected to the droop portions SA of the first wiring layer 40.

In this way, it is possible to improve the reliability of the via connection by adjusting the lengths of the droop portions SA, SB of the first copper foil 40a between the plurality of via holds VH in conformity to the deviation in the plating rate in the stacked base material 5a.

As described above, even when the deviation in the plating rate occurs in the via hole VH or in the stacked base material 5a, it is possible to make timings at which the metal-plated layer 60 is to be connected to the droop portions of the first wiring layer 40 substantially uniform over the entire substrate.

Therefore, since it is possible to securely connect the metal-plated layer 60 to all of the droop portions of the first wiring layer 40, it is possible to improve the reliability of the via connection.

In the meantime, it is also possible to adjust the shapes and lengths of the droop portions of the first copper foil 40a by adjusting a variety of conditions of the press working such as a pressing force of the punch 56 and a pressing speed of the punch 56, in addition to the clearance of the die 50.

In the below, a manufacturing method is described using a wiring member having the via structure shown in FIG. 8B.

As shown in FIG. 13A, the second wiring layer 42 is formed by patterning the second copper foil 42a on the lower surface-side of the wiring member shown in FIG. 8B with the photolithography and the wet etching.

Then, as shown in FIG. 13B, a first solder resist layer 12 having openings 12a formed on the connection parts of the first wiring layer 40 and the metal-plated layer 60 is formed at the upper surface-side of the insulating layer 10. Likewise, a second solder resist layer 14 having openings 14a formed on the connection parts of the second wiring layer 42 is formed at the lower surface-side of the insulating layer 10.

Subsequently, as shown in FIG. 14, a surface-treated layer 44 is formed on the connection parts in the openings 12a of the first solder resist layer 12 at the upper surface-side of the insulating layer 10. Likewise, a surface-treated layer 46 is formed on the connection parts in the openings 14a of the second solder resist layer 14 at the lower surface-side of the insulating layer 10.

The surface-treated layers 44, 46 are obtained by forming a nickel (Ni) layer and a gold (Au) layer in order from below with the electrolytic plating or electroless plating.

By the above processes, a wiring substrate 1 of the exemplary embodiment is obtained, as shown in FIG. 14.

As shown in FIG. 14, the wiring substrate 1 of the exemplary embodiment has the insulating layer 10 at the central portion in the thickness direction. The first adhesive layer 20 is formed on one surface of the insulating layer 10. Also, the second adhesive layer 22 is formed on the other surface of the insulating layer 10. The first adhesive layer 20, the insulating layer 10 and the second adhesive layer 22 are formed with the via holes VH penetrating in the thickness direction.

The first wiring layer 40 is formed on one surface of the insulating layer 10 via the first adhesive layer 20. The first wiring layer 40 has the droop portions S at the end-sides of the side surfaces of the via holes VH.

In the example of FIG. 14, the droop portion S of the first wiring layer 40 covers parts of the side surface of the first adhesive layer 20 and the side surface of the insulating layer 10. Alternatively, like the via hole VH of FIG. 6, a structure where the side surface of the droop portion S of the first wiring layer 40, the side surface of the first adhesive layer 20 and the side surface of the insulating layer 10 are flush with each other is also possible.

One surface of the insulating layer 10 around the via hole VH is configured as the convex curved surface 10a, and the droop portion S of the first wiring layer 40 is arranged on the convex curved surface 10a.

Also, the other surface of the insulating layer 10 is formed with the second wiring layer 42 via the second adhesive layer 22. The second wiring layer 42 is arranged to block the openings of the via holes VH at the other surface-side of the insulating layer 10.

Alternatively, the first adhesive layer 20 and the second adhesive layer 22 may be omitted, and the first wiring layer 40 and the second wiring layer 42 may be directly formed on both surfaces of the insulating layer 10.

In the exemplary embodiment, the first wiring layer 40 and the second wiring layer 42 are respectively formed of the first copper foil 40a and the second copper foil 42a but may also be formed of a variety of metal layers for wiring.

In the via holes VH, the metal-plated layer 60 for connecting the second wiring layer 42 and the droop portions S of the first wiring layer 40 is formed. The metal-plated layer 60 is formed as a via conductor made of copper or the like.

Also, the first solder resist layer 12 having openings 12a formed on the connection parts of the first wiring layer 40 and the metal-plated layer 60 is formed at the upper surface-side of the insulating layer 10. Likewise, the second solder resist layer 14 having openings 14a formed on the connection parts of the second wiring layer 42 is formed at the lower surface-side of the insulating layer 10.

Also, the surface-treated layer 44 is formed on the connection parts in the openings 12a of the first solder resist layer 12 at the upper surface-side. Likewise, the surface-treated layer 46 is formed on the connection parts in the openings 14a of the second solder resist layer 14 at the lower surface-side.

In the wiring substrate 1 of the exemplary embodiment, the droop portions S of the first wiring layer 40 are arranged at the end-sides of the via holes VH. For this reason, when forming the metal-plated layer 60 from the bottom surfaces of the via holes VH toward the upper side, the metal-plated layer 60 is securely connected to the droop portions S of the first wiring layer 40 with high reliability.

Also, as described in FIGS. 9A, 9B and 10, the plating rate may be slower at one end E1 of the via hole VH than at the other end E2. In this case, the length of the droop portion S1 of the first wiring layer 40 at one end E1 of the via hole VH is set to be greater than the length of the droop portion S2 at the other end E2.

Thereby, as shown in FIG. 10, even when the deviation in the plating rate occurs in the via hole VH, since the length of the droop portion S of the first wiring layer 40 at one end E1 at which the plating rate is slower is greater, the metal-plated layer 60 and the first wiring layer 40 can be securely connected to each other.

In this way, when there is the deviation in the plating rate in one via hole VH, the lengths of the droop portions S of the first wiring layer 40 in the via hole VH are made different.

Also, as described in FIGS. 11A, 11B and 12, the plating rate may be slower in the via hole VH arranged in one region of the stacked base material 5a. In this case, the length of the droop portion S of the first wiring layer 40 at the portion at which the plating rate is slower is set to be greater than the length of the droop portion S of the first wiring layer 40 at the portion at which the plating rate is faster.

Thereby, as shown in FIG. 12, since the length of the droop portion S of the first wiring layer 40 is greater in the via hole VH at the portion at which the plating rate is slower, even when the height of the metal-plated layer 60 is low, the metal-plated layer 60 is connected to the droop portion S of the first wiring layer 40.

As described above, according to the wiring substrate 1 of the exemplary embodiment, since the metal-plated layer 60 in the via holes VH is connected to all of the droop portions S of the first wiring layer 40, it is possible to improve the reliability of the via connection.

Also, unlike the exemplary embodiment, according to a structure where the first wiring layer having a flat shape and having no droop portion on the side surface of the via hole and the insulating layer are exposed, when the thermal stress is generated, the stress is likely to be concentrated on the insulating layer at the upper end of the via hole. For this reason, a crack is likely to be generated from the insulating layer at the upper end of the via hole toward an inside.

The thermal stress is generated in the wiring substrate 1 when flip chip-connecting a semiconductor chip to the wiring substrate 1 by reflow heating, when actually using an electronic component device, or the like.

However, in the exemplary embodiment, one surface of the insulating layer 10 around the via holes VH is configured as the convex curved surface 10a and the droop portion S of the first wiring layer 40 cover the side surfaces of the insulating layer 10 at the upper end of the via hole VH. For this reason, the stress to be concentrated on the insulating layer 10 at the upper end of the via hole VH is relieved, so that it is possible to prevent a crack from being generated from the upper end of the via hole VH into the insulating layer 10.

In this way, the wiring substrate 1 of the exemplary embodiment is robust to the thermal stress, so that it is possible to improve the reliability.

Subsequently, a method of mounting an electronic component on the wiring substrate 1 of FIG. 14 to establish an electronic component device is described.

Figure 15:
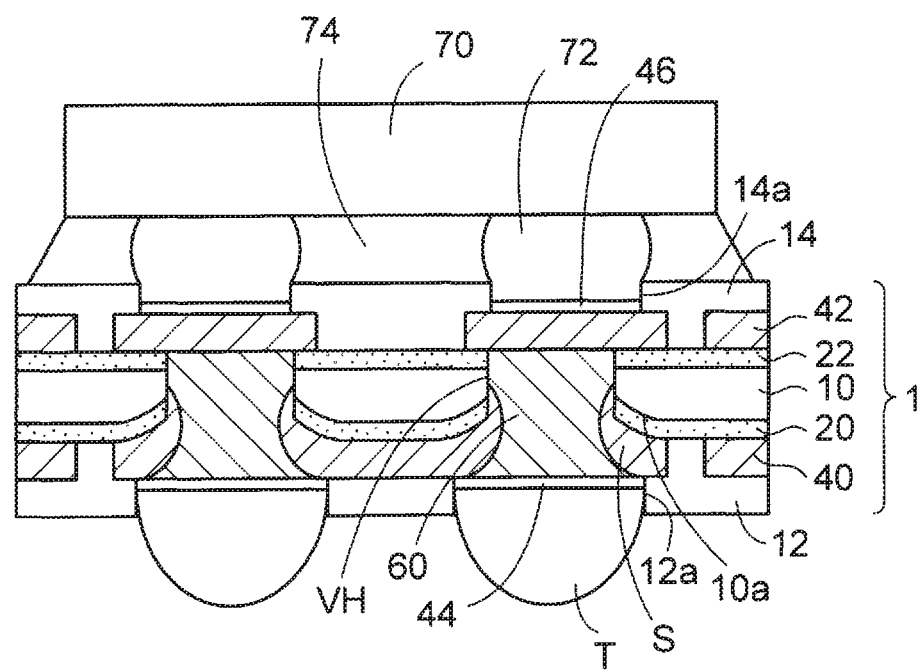
FIG. 15 is a sectional view depicting an example of an electronic component device where a semiconductor chip is mounted on the wiring substrate of the exemplary embodiment.

As shown in FIG. 15, the wiring substrate 1 of FIG. 14 is vertically reversed. Then, as an electronic component, a semiconductor chip 70 having bump electrodes 72 provided on a lower surface is prepared. Subsequently, the bump electrodes 72 of the semiconductor chip 70 are flip chip-connected to the connection parts of the second wiring layer 42 of the wiring substrate 1 via solders.

Also, an underfill resin 74 is filled in a gap between the semiconductor chip 70 and the wiring substrate 1. Thereafter, solder balls are mounted on the connection parts of the first wiring layer 40 and the metal-plated layer 60 of the wiring substrate 1, so that external connection terminals T are formed.

In the wiring substrate 1 of the exemplary embodiment, the metal-plated layer 60 may be formed with being depressed toward the inside of the via holes VH at the surface-side of the first wiring layer 40 of the insulating layer 10, which is disadvantageous when forming a fine flat pattern.

In contrast, since the openings of the via holes VH are blocked by the second wiring layer 42 at the surface-side of the second wiring layer 42 of the insulating layer 10, it is possible to form the second wiring layer 42 as a fine flat pattern.

Therefore, in the wiring substrate 1 of the exemplary embodiment, it is possible to arrange pads of the second wiring layer 42 in correspondence to the high-performance semiconductor chip having terminals arranged with a narrow pitch.

Alternatively, it is possible to mount the semiconductor chip at the first wiring layer 40-side of the wiring substrate 1 and to form the second wiring layer 42 with the external connection terminals.

This disclosure further encompasses various exemplary embodiments, for example, described below.

1. A method of manufacturing a wiring substrate, comprising:

preparing a stacked base material having an insulating layer and a first metal layer formed on an upper surface of the insulating layer;

forming at least one via hole in the stacked base material by punching using a punch and obtaining a droop portion of the first metal layer at an end-side of the via hole;

forming a second metal layer on a lower surface of the insulating layer; and forming a metal-plated layer configured to connect the second metal layer and the droop portion of the first metal layer in the via hole by an electrolytic plating where the second metal layer is used as a power feeding path for plating.

2. The method according to claim 1, wherein in the obtaining the droop portion of the first metal layer, an upper surface of the insulating layer around the via hole is formed as a convex curved surface and the droop portion of the first metal layer is arranged on the convex curved surface.

3. The method according to claim 1 or 2, wherein in the obtaining the droop portion of the first metal layer, the droop portion of the first metal layer covers a side surface of the via hole.

4. The method according to claim 3, wherein in the obtaining the droop portion of the first metal layer, a length of the droop portion of the first metal layer is adjusted in at least two positions of the via hole, in conformity to a deviation in rate of the electrolytic plating in each position of the via hole.

5. The method according to claim 3, wherein in the forming the vial hole, a plurality of the via holes are formed, and in the obtaining the droop portion of the first metal layer, lengths of the droop portions of the first metal layer are adjusted between the plurality of the via holes, in conformity to a deviation in rate of the electrolytic plating in the stacked base material.

The invention claimed is:

1. A wiring substrate comprising:
    an insulating layer;
    at least one via hole formed in the insulating layer;
    a first wiring layer formed on one surface of the insulating layer and having a droop portion at an end-side of the via hole;
    a second wiring layer formed on the other surface of the insulating layer; and
    a metal-plated layer formed in the via hole and configured to connect the second wiring layer and the droop portion of the first wiring layer,
    wherein one surface of the insulating layer around the via hole is formed as a convex curved surface and the droop portion of the first wiring layer is arranged on the convex curved surface.

2. The wiring substrate according to claim 1, wherein the droop portion of the first wiring layer is configured to cover a side surface of the via hole.

3. The wiring substrate according to claim 2, wherein a length of the droop portion of the first wiring layer is different in at least two positions of the via hole.

4. The wiring substrate according to claim 2, wherein a plurality of the via holes are formed in the insulating layer, and lengths of the droop portions of the first wiring layer are different between the plurality of the via holes.

* * * * *